United States Patent [19]

Kwon

[11] Patent Number: 5,462,624
[45] Date of Patent: Oct. 31, 1995

[54] EMBEDDED INTER-CONNECT FRAME

[75] Inventor: Young I. Kwon, San Jose, Calif.

[73] Assignee: VLSI Technology, Inc., San Jose, Calif.

[21] Appl. No.: 233,736

[22] Filed: Apr. 26, 1994

Related U.S. Application Data

[63] Continuation of Ser. No. 995,246, Dec. 22, 1992, abandoned.

[51] Int. Cl.⁶ .................................................. B32B 31/00
[52] U.S. Cl. .................. 156/257; 174/52.2; 257/676; 257/784; 437/67; 437/78; 437/90; 437/203
[58] Field of Search ................ 156/257; 174/52.2, 174/52.4; 257/676, 784, 787; 437/51, 67, 68, 78, 90, 203

[56] References Cited

U.S. PATENT DOCUMENTS

| | | | |
|---|---|---|---|
| 4,038,582 | 7/1977 | Horwinski | 315/129 |
| 4,327,476 | 5/1982 | Iwai et al. | 437/59 |
| 5,052,777 | 10/1991 | Ninnis et al. | 385/19 |
| 5,233,130 | 8/1993 | Nishino | 174/52.2 |
| 5,240,867 | 8/1993 | Suzuki et al. | 437/31 |
| 5,323,035 | 6/1994 | Leedy | 257/784 X |
| 5,341,027 | 8/1994 | Park et al. | 257/784 X |

*Primary Examiner*—David A. Simmons
*Assistant Examiner*—Paul M. Rivard
*Attorney, Agent, or Firm*—Paul Hickman

[57] ABSTRACT

Method and apparatus for connecting an I/O pad of an integrated circuit die to an electrical lead or contact on a lead frame that uses interposers formed directly on the die attach pad of the lead frame. Each interposer is formed by etching one or more grooves, preferably of depth no more than half the die attach pad thickness, in the die attach pad adjacent to the lead frame electrical lead(s). The exposed surfaces of the grooves and the die attach pad are coated with a layer of electrically insulating material, and the grooves are then filled with an electrically conducting material, such as conductive epoxy. An electrically conducting wire is then bonded between an I/O pad of an integrated circuit die and the electrically conducting material in the groove, and between the electrically conducting material and an electrical lead of a lead frame. Self-inductance and mutual inductance of the circuit line segments running from the die attach pad to the lead frame electrical lead(s) are reduced by control of the groove dimensions.

20 Claims, 3 Drawing Sheets

EMBEDDED INTER-CONNECT FRAME

This is a continuation of application Ser. No. 07/995,246 filed Dec. 22, 1992 abandoned.

BACKGROUND OF THE INVENTION

1. Field of the Invention

This invention relates to integrated circuit packaging, and more particularly to wire bonding in a lead frame assembly.

2. Background of the Technical Art

The term "integrated circuit" usually refers to an integrated circuit die and the packaging associated with the die. A common way to package an integrated circuit die is to attach the die to a lead frame and encapsulate the structure in plastic. A typical lead frame includes a die attach pad and a number of bonding fingers that are electrically connected to the die by bonding wires.

Integrated circuit dies are designed with ever-smaller feature sizes to increase performance and to reduce the cost of an individual integrated circuit. An integrated circuit die with smaller feature sizes will often have smaller dimensions than a functionally equivalent integrated circuit die having larger feature sizes. Although integrated circuit die sizes are becoming smaller, integrated circuit package sizes are commonly fixed by standards and conventions adopted by the electronics industry.

When small die are packaged within lead frames designed for larger die, the manufacturing yield of the packaged die often suffers. Because a die is physically smaller than optimum for that package, longer bonding wires are required to electrically connect the die to the bonding fingers on the lead frame. These longer bonding wires are often quite flexible and can short out through contact with adjacent bonding wires. This may occur through an intrinsic twist of the bonding wires or because of forces developed during the encapsulation process.

One solution to this problem, i.e. making lead frames that accommodate smaller die sizes, is expensive. The bonding fingers of the lead frame become so small and so closely spaced that the lead frames must be formed by an expensive etching process, rather than by an economical stamping process.

Another solution to this problem is to use what is known as an interposer. A plurality of intermediate bonding islands are provided on the die attach pad of the lead frame so that the die can be electrically connected to the corresponding bonding wire in two or more jumps through intermediate or interposed connections at the bonding islands. The bonding pads of the die are wired to bonding islands of an interposer with a first (inner) set of wires. The bonding islands are then wired to the bonding fingers of the lead frame with a second (outer) set of wires. By making the electrical connections between the die and the bonding fingers in two or more jumps, the longer direct connections are replaced by two or more sets of shorter wires that are less likely to experience shorting than are longer connections.

Interposers in the prior art are usually small printed circuit boards having a relatively thick, rigid, insulating substrate upon which the conductive islands are formed. The printed circuit boards are attached to the die attach pads of the lead frame and are provided with central apertures to allow attachment of an integrated circuit die through interposers to the die attach pads.

While interposers perform their function admirably, they do have some disadvantages. First, interposers now available are relatively expensive because they are essentially miniature printed circuit boards. Second, because the size of a die aperture is fixed, a particular interposer can only be used for a small range of die sizes. An interposer cannot be used when the die size is larger than the diameter of the die aperture. Third, if an interposer is used with a die whose size is much smaller than the size of the die aperture, the inner set of wires must be made longer, which reduces the effectiveness of the interposer. Fourth, the bonding islands have intrinsic inductances, which can degrade high frequency performance of the associated integrated circuits.

What is needed is an interposer technique that allows fabrication of interposers at lower cost and with more control of electrical inductances and relevant dimensions of these interposers.

SUMMARY OF THE INVENTION

These needs are met by the invention, which provides a method and apparatus for connecting an integrated circuit die to electrical leads on a lead frame. The method begins by etching a groove on a die attach pad, where the depth of the groove is preferably no more than half the thickness of the die attach pad. By not etching entirely through the die attach pad, a higher pitch can be attained between adjacent grooves, which can become important with an increase in the number of interconnections between an integrated circuit die and a lead frame's electrical lead(s). The grooves and die attach pad are then conformably coated with an electrically insulating material. The coated grooves are then filled with an electrically conducting material, such as conductive epoxy, to form a plurality of electrically conducting groove regions. A first plurality of conducting wires are then connected between the IC die and the conducting groove regions, and a second plurality of conducting wires are connected between the conducting groove regions and the electrical lead(s) on the lead frame. One set, or more than one set, of these conducting groove regions or interposers may be used, depending upon the distance between the die attach pad(s) and the electrical lead(s) of the lead frame.

The method of the present invention allows selective placement of interposers on the die attach pad, at the modest cost of etching one or more grooves therein and filling the grooves with an electrically conductive material. The groove dimensions are easily controlled so that the electrical inductance of such a groove can also be controlled.

The apparatus of the present invention comprises a lead frame assembly with electrical lead(s) connected to an integrated circuit I/O pad. The assembly includes a die attach pad with one or more surface grooves. The grooves, with a depth of preferably less than half the die attach pad thickness, have a layer of an electrically insulating material covering their exposed surfaces. An electrically conducting material at least partly fills the grooves and covers this insulating layer. A plurality of electrically conducting wires connect the conducting groove regions to the integrated circuit I/O pad. A second plurality of electrically conducting wires connect the conducting groove regions to the electrical lead(s) on the lead frame.

These and other advantages of the present invention will become apparent to those skilled in the art upon a reading of the following specification of the invention and a study of the several figures of the drawing.

DETAILED DESCRIPTION OF THE PREFERRED EMBODIMENTS

Figure 1:
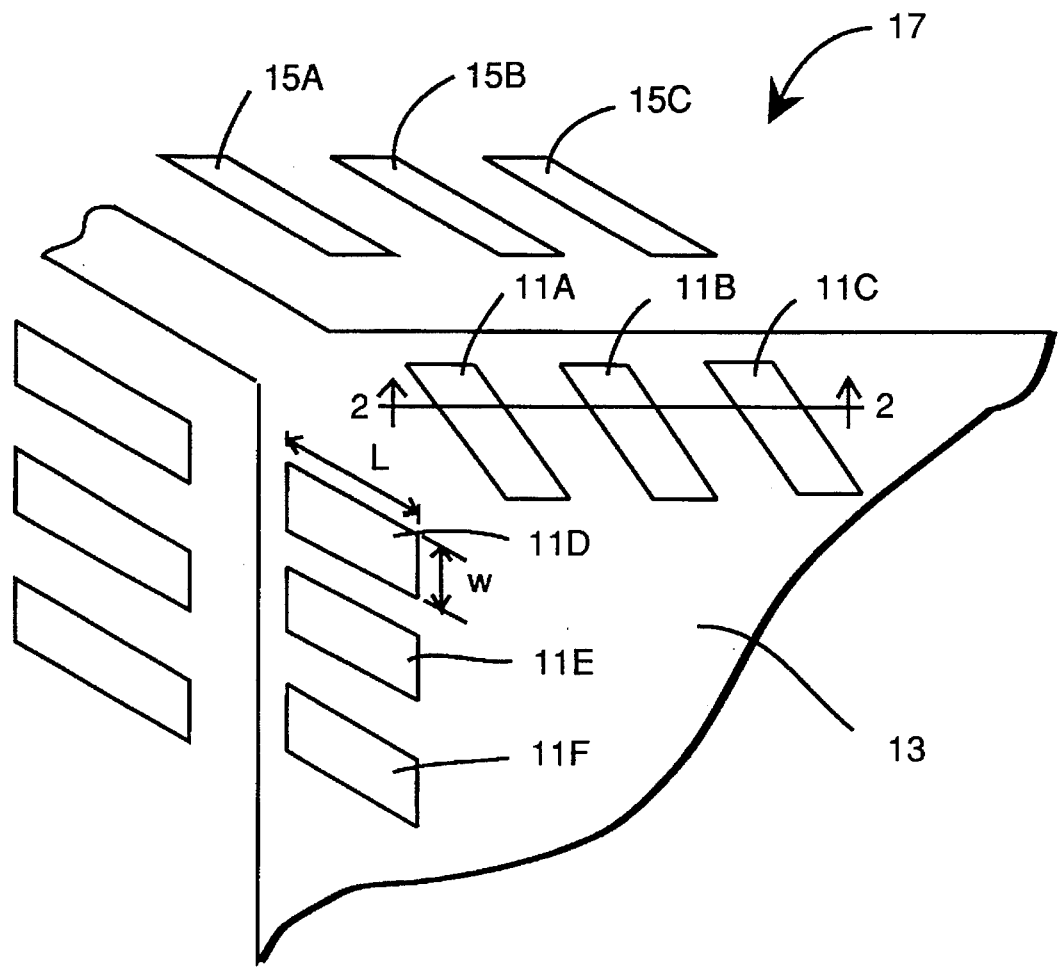
FIG. 1 is a top plan view of a structure formed for practicing the invention.
Figure 2:
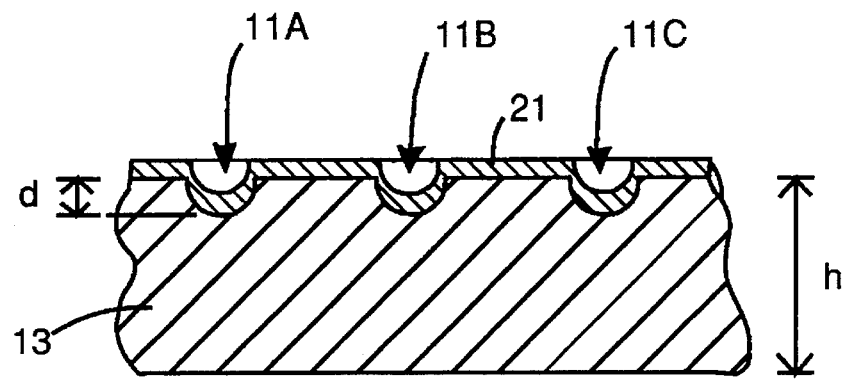
FIG. 2 is a cross-sectional view taken along line 2—2 of FIG. 1.

FIG. 1 is a top plan view illustrating placement of interposers according to the present invention. A plurality of "half-etch" grooves 11A, 11B, 11C, etc. are formed in the die attach pad 13, adjacent to, but spaced apart from, corresponding lead tips of bonding fingers 15A, 15B, 15C, etc. on a lead frame 17. The lead frame itself is conventional in construction. Each half-etch groove 11A, 11B, 11C is preferably formed as a recess etched partially through the underlying die attach pad 13, with the exposed surface of each recess being covered with a thin dielectric coating layer 21, as shown in FIG. 2. The material for the dielectric coating layer 21 can be any suitable material, such as an insulating paint, epoxy, etc. The etching process itself is conventional including providing a mask over the pad, performing the etch process, and removing the mask. The shape, width w and length L of a half-etch groove, is arbitrary, but the depth d of any such groove is preferably no more than 50 percent of the thickness h of the die attach pad 13, and definitely should not extend through the die attach pad 13. A higher pitch between adjacent grooves results from only partially etching through the die attach pad, which can become important as the number of interconnections increases. The depth d of a half-etch groove is controlled by techniques well known in the art, i.e. timing the wet or dry etching process, using an end-point detector, etc. As used herein, "half-etch" means a partial etch of the die attach pad which does not etch completely through the pad, and it does not necessarily mean that the etch is halfway through the pad.

Figure 3:
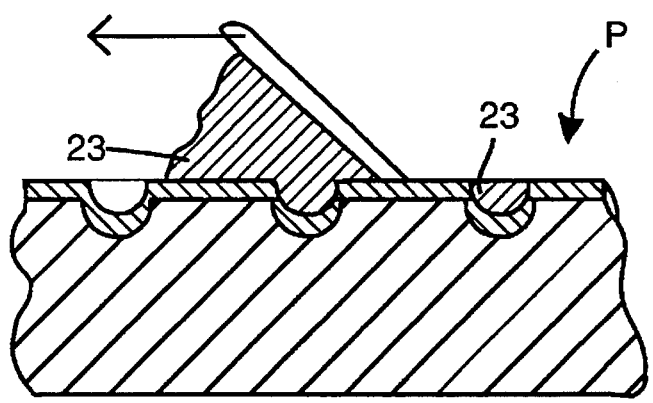
FIG. 3 is the cross-sectional view of FIG. 2 illustrating a method step in the preparation of the present invention.

As seen in FIG. 3, after the insulating layer 21 has stabilized, conductive epoxy material 23 is placed on a top surface of the die attach pad 13 and is forced by a squeegee or other means into each of the half-etch grooves 11A, 11B, 11C, etc. There are many commercial vendors of conductive epoxy suitable for the present invention. Preferably, the exposed surface of the conductive epoxy material 23 in the half-etch grooves 11A, 11B, 11C, etc., together with the remaining exposed surface of the dielectric material 21, forms an approximately planar surface P, as illustrated in FIG. 3. The excess material may also be removed by using an etch process that removes a portion of this conducting material and, optionally, removes a small thickness of the dielectric layer 21.

Figure 4:
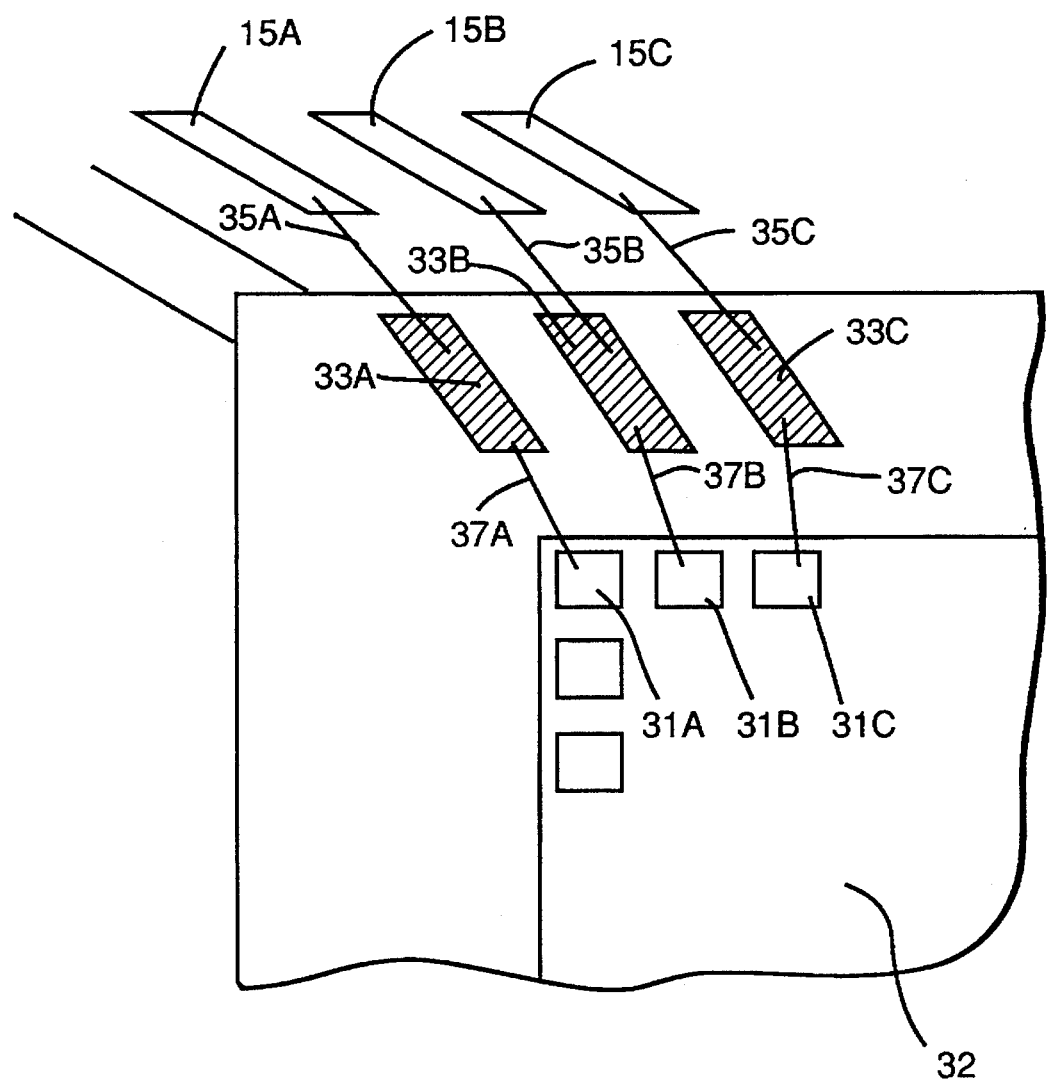
FIG. 4 is a top plan view illustrating use of the invention to provide electrical connections between die attach pads and lead frame lead tips.

As seen in FIG. 4, die I/O pads 31A, 31B, 31C, etc. of an IC die can be connected to corresponding interposers 33A, 33B, 33C, etc. with a first set of "wire jumps" 37A, 37B, 37C, etc., and these interposers can be connected to corresponding lead tips 15A, 15B, 15C, etc. of the lead frame with a second set of "wire jumps" 35A, 35B, 35C, etc. One set of interposers, or two or more sets of interposers, constructed according to the invention, can be positioned between the die I/O pads 31A, 31B, 31C, etc. and the lead frame lead tips 15A, 15B, 15C, etc., depending upon the distances between the die attach pads and the lead tips. The first and second wire jumps 35A, etc. and 37A, etc. are electrically connected to the conductive epoxy by being embedded into the epoxy or otherwise secured to the epoxy by any suitable means, e.g. with a drop of conductive epoxy. Attachment of the first wire jumps 35A, etc. to the die attach pad 13 and of the second wire jumps 37A, etc. to the lead frame 17 are performed by standard attachment processes, well known to those skilled in the art.

The cross-sectional shape of the depressions that form the half-etch grooves 11A, 11B, 11C, etc. may be a sector of a circle or oval, as shown in FIGS. 2 and 3, or may be other shapes. The inductance associated with each half-etch groove filled with conductive epoxy (FIG. 3) is proportional to the product Lw so that inductance can be controlled by controlling the product Lw. In practice, the width cannot be made too small because of manufacturing tolerances. However, a width w of 0.5–2 mm appears to be acceptable. Half-etched grooves can be formed closer together than can fully etched grooves, thus permitting higher densities of connections between IC die leads and lead frame leads.

According to a discussion by E. U. Condon in *Handbook of Physics*, ed. by E. U. Condon and H. Odishaw, McGraw-Hill, Second Ed., 1967, pp. 4–23–4–24, the self-inductance L of a length d of coaxial cable having radii a and b for the inner conductor and outer conductor, respectively, is given approximately by $$L = \alpha b \, d[\ln(b/a) - 1.75], \quad (1)$$

where $\alpha$ is a proportionality constant having the physical dimensions of inductance. Thus, the inductance L for a circuit line segment including an interposer can be made quite small, consistent with providing groove size large enough to permit bonding of two "wire jumps" to the material that fills the groove.

While this invention has been described in terms of several preferred embodiments, it is contemplated that alterations, modifications and permutations thereof will become apparent to those skilled in the art upon a reading of the specification and study of the drawings. It is intended that the following appended claims include all such alterations, modifications and permutations as fall within the spirit and scope of the present invention.

I claim:

1. A method for connecting an I/O pad of an integrated circuit die to an electrical lead on a lead frame, the method comprising the steps of:

forming a groove into a die attach pad surface, where the depth of said groove is a fraction of a thickness of said die attach pad;

forming an electrically insulating layer over said groove;

at least partly filling said groove with an electrically conducting material to form an electrically conducting groove region; and connecting an electrically conducting wire between an I/O pad of an integrated circuit die affixed to said die attach pad and said conducting groove region of said die attach pad and between said conducting groove region of said die attach pad and an electrical lead on a lead frame.

2. The method of claim 1, further comprising the step of choosing said electrically conducting material to be a conductive epoxy material.

3. The method of claim 1, wherein said step of filling said groove comprises the steps of:

depositing said electrically conducting material as a pliable mass of material adjacent to said groove;

forcing a portion of said electrically conducting material into said groove to approximately fill said groove; and removing the excess, if any, of said electrically conducting material.

4. The method of claim 1, further comprising the step of forming said groove with a curved exposed surface.

5. The method of claim 1, further comprising the step of choosing the physical dimensions of said groove so that the electrical impedance of said groove and said electrically conducting wire connected to said groove is less than a predetermined value.

6. The method of claim 1, further comprising the steps of forming a plurality of grooves and at least partly filling said plurality of grooves with said electrically conducting material.

7. Apparatus for connecting an I/O pad of an integrated circuit die to an electrical lead on a lead frame, the apparatus comprising:

a die attach pad having at least one groove formed into an exposed surface thereof, where the depth of said groove is less than a die attach pad thickness;

an electrically insulating layer covering the exposed surface of said groove;

an electrically conducting material at least partly filling said groove to form an electrically conducting groove region; and an electrically conducting wire connecting an I/O pad of an integrated circuit die affixed to said die attach pad and said electrically conducting groove region of said die attach pad, and an electrically conducting wire connecting said electrically conducting groove region of said die attach pad and an electrical lead on a lead frame.

8. The apparatus of claim 7, wherein said electrically conducting material comprises a conductive epoxy material.

9. The apparatus of claim 7, wherein said groove has a curved exposed surface and wherein said groove is approximately between 0.5 and 2.0 millimeters in width.

10. The apparatus of claim 7, wherein the physical dimensions of said groove are chosen so that the electrical impedance of said groove and said electrically conducting wire connected to said groove is less than a predetermined value.

11. The apparatus of claim 7 further comprising a plurality of grooves provided on said die attach pad, covered with said electrically insulating layer, and at least partially filled with said electrically conducting material.

12. A method for connecting an I/O pad of an integrated circuit die to an electrical lead on a lead frame, the method comprising the steps of:

forming a groove into a die attach pad surface, where the depth of said groove is a fraction of a thickness of said die attach pad;

forming an electrically insulating layer over said groove;

at least partly filling said groove with an electrically conducting material to form an electrically conducting groove region;

connecting a first electrically conducting wire between an I/O pad of an integrated circuit die and said conducting groove region; and connecting a second electrically conducting wire between said conducting groove region and an electrical lead on a lead frame.

13. The method of claim 12, further comprising the step of choosing said electrically conducting material to be a conductive epoxy material.

14. The method of claim 12, wherein said step of filling said groove comprises the steps of:

depositing said electrically conducting material as a pliable mass of material adjacent to said groove;

forcing a portion of said electrically conducting material into said groove to approximately fill said groove; and removing the excess, if any, of said electrically conducting material.

15. The method of claim 12, further comprising the step of forming said groove with a curved exposed surface.

16. The method of claim 12, further comprising the step of choosing the physical dimensions of said groove so that the electrical impedance of said groove and said electrically conducting wire connected to said groove is less than a predetermined value.

17. The method of claim 12, further comprising the steps of forming a plurality of grooves and at least partly filling said plurality of grooves with said electrically conducting material.

18. Apparatus for connecting an I/O pad of an integrated circuit die to an electrical lead on a lead frame, the apparatus comprising:

a die attach pad having at least one groove formed into an exposed surface thereof, where the depth of said groove is less than a die attach pad thickness;

an electrically insulating layer covering the exposed surface of said groove;

an electrically conducting material at least partly filling said groove to form an electrically conducting groove region;

a first electrically conducting wire connecting an I/O pad of an integrated circuit die and said electrically conducting groove region; and a second electrically conducting wire connecting said electrically conducting groove region and an electrical lead on a lead frame.

19. The apparatus of claim 18, wherein said electrically conducting material comprises a conductive epoxy material and wherein said groove has a curved exposed surface.

20. The apparatus of claim 18, wherein the physical dimensions of said groove are chosen so that the electrical impedance of said groove and said electrically conducting wire connected to said groove is less than a predetermined value and wherein said groove is approximately between 0.5 and 2.0 millimeters in width.

* * * * *